United States Patent
Sasaki et al.

[19]

[11] Patent Number: 5,889,651
[45] Date of Patent: *Mar. 30, 1999

[54] CIRCUIT BOARD COOLING APPARATUS

[75] Inventors: Tomiya Sasaki, Otawara; Hideo Iwasaki, Kawasaki, both of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 656,869
[22] Filed: May 30, 1996

[30] Foreign Application Priority Data

May 31, 1995 [JP] Japan ................................ 7-132464

[51] Int. Cl.$^6$ ........................................................ H05K 7/20
[52] U.S. Cl. ........................ 361/699; 165/908; 361/719
[58] Field of Search ........................... 324/158.1, 72.5, 324/96, 753, 758, 760; 165/104.33, 80.3, 80.4, 908; 257/712, 713, 714, 721; 62/259.2; 361/690–696, 689, 699, 700, 701, 717–719, 784, 785, 791, 796, 720, 721

[56] References Cited

U.S. PATENT DOCUMENTS

| | | | |
|---|---|---|---|
| 4,093,021 | 6/1978 | Groom | 361/693 |
| 4,399,484 | 8/1983 | Mayer | 165/908 |
| 4,498,118 | 2/1985 | Bell | 165/908 |
| 4,862,075 | 8/1989 | Choi | 324/158 F |
| 5,021,924 | 6/1991 | Kieda et al. | 361/699 |
| 5,270,572 | 12/1993 | Nakajima et al. | 361/699 |
| 5,428,503 | 6/1995 | Matsushima | 361/695 |
| 5,522,452 | 6/1996 | Mizuno | 165/40 |

FOREIGN PATENT DOCUMENTS

| | | | |
|---|---|---|---|
| 2624684 | 6/1989 | France | 361/699 |
| 1-189573 | 7/1989 | Japan . | |
| 4162497 A | 6/1992 | Japan | 361/689 |

*Primary Examiner*—Gerald Tolin
*Attorney, Agent, or Firm*—Oblon, Spivak, McClelland, Maier & Neustadt, P.C.

[57] ABSTRACT

A supply pipe for supplying air to the peripheral surface of a circuit board container unit is provided in a test head. Nozzles are connected to the supply pipe. Each nozzle has at least one hole opposing a circuit board and corresponding to one IC on the circuit board. The circuit board has a parts mounted portion that generates a small amount of heat. The circuit board is covered with a case. A vent hole is formed on the microscope column side. A discharge pipe is connected to the vent hole and communicates with the outside of the test head. With this arrangement, each circuit board can be uniformly and efficiently cooled.

15 Claims, 7 Drawing Sheets

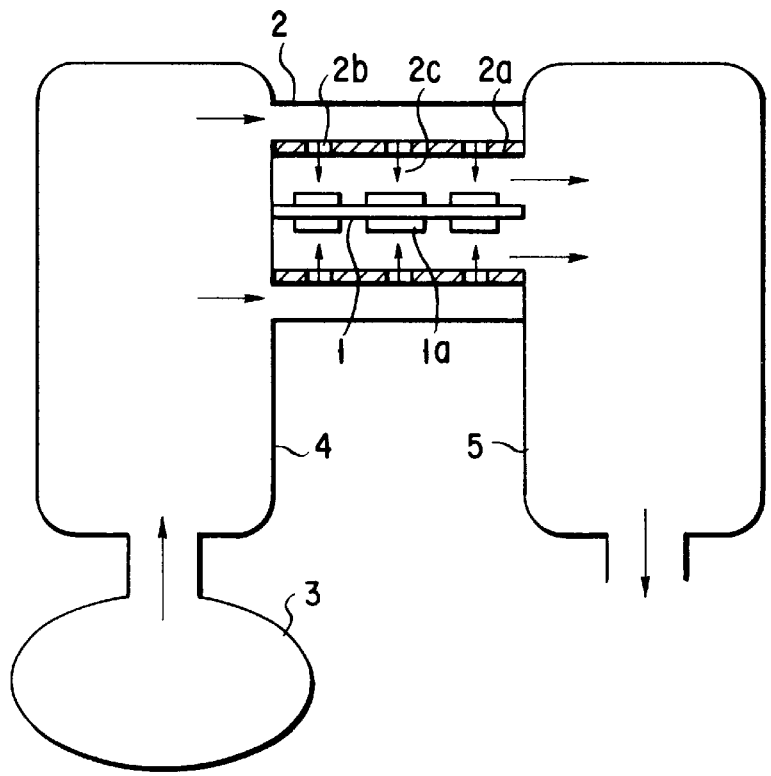
F I G. 2

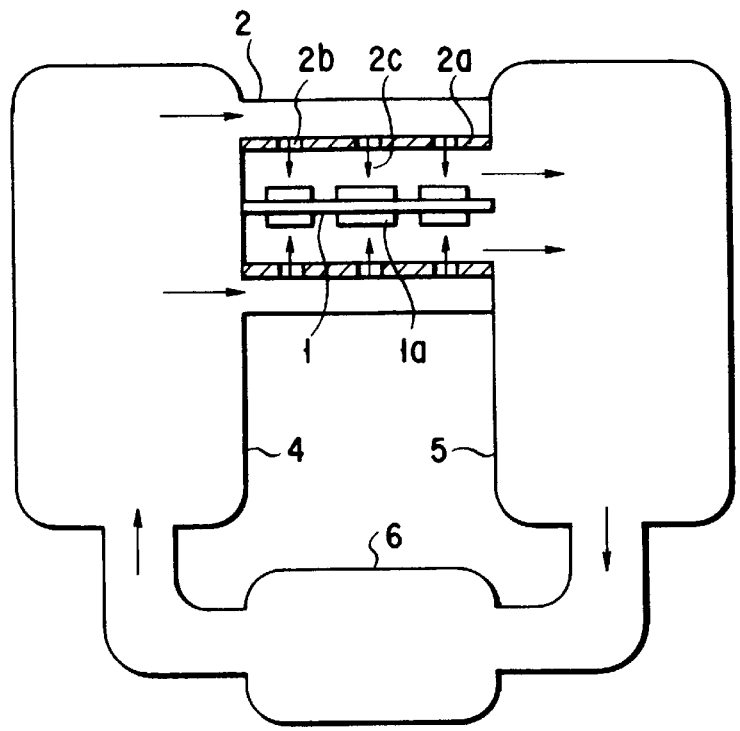
F I G. 3
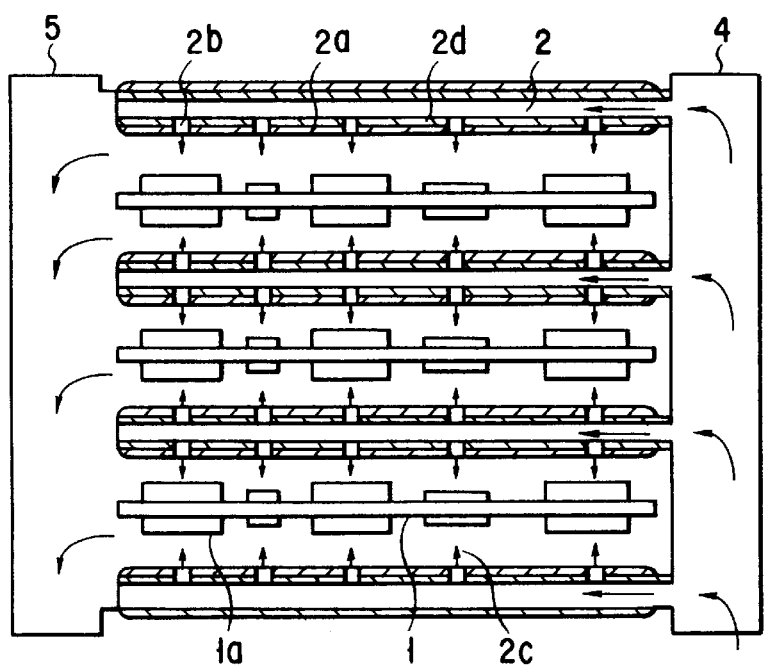
F I G. 4

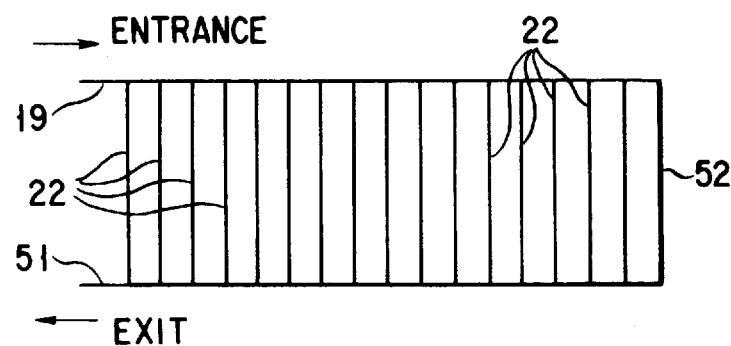
F I G. 11
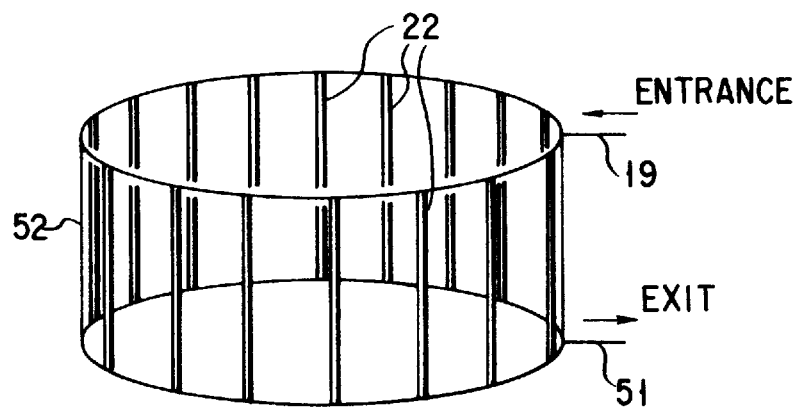
F I G. 12

CIRCUIT BOARD COOLING APPARATUS

BACKGROUND OF THE INVENTION

1. Field of the Invention

The present invention relates to a circuit board cooling apparatus for a test equipment for testing a semiconductor device such as an integrated circuit (IC).

2. Description of the Related Art

For semiconductor devices such as integrated circuits, function tests including a characteristic test and a performance test of semiconductor devices are performed during or after their manufacturing process. These tests are performed by connecting a semiconductor device to be tested to a test circuit including a plurality of circuit boards on which a plurality of ICs are mounted. In the test, a circuit board cooling apparatus is used to suppress heat generated from the ICs and the like on the circuit boards.

The arrangement of a conventional circuit board cooling apparatus will be described below with reference to FIG. 1.

A plurality of circuit boards 102 are arranged radially at given angular intervals 107 (108) in a circuit board container unit 101. A plurality of large-scale integrated circuits are mounted on each circuit board 102. A contact board 103 is arranged on the top of the circuit board container unit 101 near the central portion of the circuit boards 102. A semiconductor device 104 to be tested such as an IC is mounted on the contact board 103.

The ICs (not shown) on the circuit boards 102 and the contact board 103 are electrically connected to each other at corresponding portions with lead lines (not shown). With this arrangement, the test circuit can supply a test signal to the input terminal of the semiconductor device 104 to be tested mounted on the contact board 103 or measure an output signal from the output terminal of the semiconductor device 104 to be tested.

A plurality of fans 105 and 106 are arranged in the circuit board container unit 101 to surround the radially arranged circuit boards 102.

In the semiconductor test apparatus having the above arrangement, when the semiconductor device 104 to be tested is mounted on the contact board 103 and tested, heat is generated from the plurality of ICs and the like mounted on the circuit boards 102. The fans 105 are driven to send air from the peripheral side of the circuit board container unit 101. The air is supplied to the intervals 107 between the nearby circuit boards 102 and flows from the peripheral side of the circuit board container unit 101 to the central portion where the contact board 103 is arranged. Thereafter, the air flows from the central portion to the peripheral side through intervals 108 between other circuit boards 102 and is discharged by the fans 106 from the circuit board container unit 101. Arrows in FIG. 1 indicate one example of air flow.

With the above arrangement, the cooling effect changes in units of circuit boards or in units of ICs on each circuit board. For example, the cooling effect for ICs on a circuit board directly exposed to the air sent from the fan differs from that for ICs on a circuit board exposed to the hot air that has passed by the former circuit board. For this reason, a large difference in electrical characteristics is produced between the circuit boards during the test, adversely affecting the test result of the target object, i.e., the semiconductor device to be tested.

In recent years, an improvement in performance or integration of semiconductor devices to be tested is in progress, and the number of circuit boards arranged in the circuit board container unit or the number of mounted ICs is largely increasing. Therefore, the circuit boards must be further efficiently cooled by eliminating the difference in cooling effect between the circuit boards or ICs, and at the same time, achieving a size reduction of the circuit board container unit.

SUMMARY OF THE INVENTION

It is an object of the present invention to provide a circuit board cooling apparatus capable of uniformly and efficiently cooling circuit boards having high integration.

According to the present invention, there is provided a circuit board cooling apparatus for cooling a plurality of circuit boards on which semiconductor elements are mounted, comprising: a plurality of nozzles each arranged between the plurality of circuit boards and having a plurality of ejection holes for ejecting a cooling medium at a predetermined position on the circuit board; and a cooling medium supply pipe for supplying the cooling medium to the nozzles. With this arrangement, each heat generating element can be controlled to a predetermined temperature by impingement cooling.

In the above circuit board cooling apparatus, the nozzle may have a frame for guiding the cooling medium, and a perforated plate detachably connected to the frame and having the plurality of ejection holes. With this structure, only the perforated plate can be exchanged.

The nozzle may be supported by the cooling medium supply pipe. The nozzle may be supported by the plurality of circuit boards and connected to the cooling medium supply pipe through a flexible pipe.

The circuit board cooling apparatus may further comprise a packing having flexibility and arranged between the frame and the perforated plate. With this arrangement, the cooling medium can be prevented from leaking, and ejection of the cooing medium from the ejection holes is ensured.

The positions of the ejection holes formed in the perforated plate are preferably determined in accordance with the heat generation distribution of the circuit board.

The number of ejection holes per unit area may be larger at a position on the perforated plate opposing a semiconductor element on the circuit board which generates heat, than that at any other position. Alternatively, the size of the ejection hole may be larger at a position on the perforated plate opposing a semiconductor element on the circuit board which generates heat, than that at any other position. With this arrangement, the uniformity and effect of the cooling operation can be improved.

The circuit board cooling apparatus may further comprise a case containing the plurality of circuit boards, and the case may constitute a closed housing together with the cooling medium supply pipe. This arrangement allows effective circulation of the cooling medium, effective noise prevention, and effective measures against dust.

The circuit board cooling apparatus may further comprise a heat exchanger connected between the cooling medium supply pipe and said nozzles. With this arrangement, the cooling medium can be effectively circulated.

The plurality of circuit boards may be arranged radially, and the cooling medium supply pipe may be arranged at a peripheral portion of the plurality of circuit boards. With this arrangement, high-speed signal processing at the time of testing or wires of equal lengths can be effectively achieved.

The cooling medium supplied by the cooling medium supply pipe may be air. This cooling medium can be conveniently obtained at a low cost. The cooling medium supplied by the cooling medium supply pipe may be SF6 gas or a compound of carbon and fluorine having electrical insulating characteristics (e.g., a fluorocabon). In this case, the cooling medium is excellent in heat transfer characteristics. In case of using a fluid compound of carbonized fluorine, a cooling by boiling can be carried out, and thus a great deal of heat radiation is effected.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 2 is a schematic view for explaining the basic principle of the present invention;

FIG. 3 is another schematic view for explaining the basic principle of the present invention;

FIG. 4 is a sectional view showing a detailed structure of a circuit board cooling apparatus according to the basic principle of the present invention;

FIG. 11 is a schematic view showing the first arrangement of a cooling pipe and an auxiliary pipe which are used in the circuit board cooling apparatus shown in FIG. 7; and FIG. 12 is a schematic view showing the second arrangement of the cooling pipe and the auxiliary pipe which are used in the circuit board cooling apparatus shown in FIG. 7.

DETAILED DESCRIPTION OF THE PREFERRED EMBODIMENTS

Figure 1:
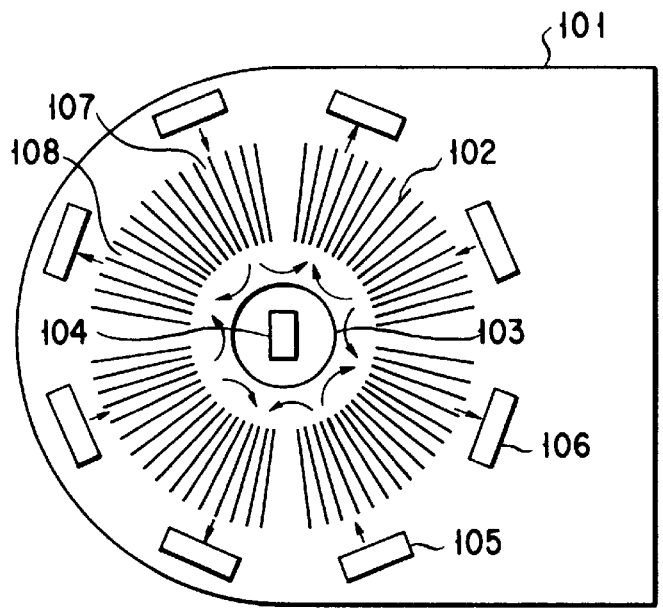
FIG. 1 is a plan view schematically showing the arrangement of a conventional circuit board cooling apparatus.

Before a description of the embodiments of the present invention, the basic principle of the present invention will be described first to help understand the present invention.

FIG. 2 is a schematic view for explaining the basic principle of the present invention. As shown in FIG. 2, a circuit board 1 on which semiconductor elements are mounted is arranged in a circuit board 1 cooling apparatus. Nozzles 2 for flowing a cooling medium are arranged parallel to the circuit board 1. A cooling medium source 3 for supplying the cooling medium is arranged outside the circuit board cooling apparatus. The cooling medium supplied from the cooling medium source 3 is supplied to the nozzles 2 through a cooling medium supply pipe 4. The nozzle 2 has a perforated plate. The cooling medium is ejected from a plurality of ejection holes 2b of the perforated plate to the semiconductor elements as a heat source on the circuit board 1. With this operation, the semiconductor elements which generate heat are cooled. After cooling the semiconductor elements, the cooling medium is recovered by a cooling medium recovery pipe 5 and discharged from the apparatus.

With the semiconductor cooling apparatus having the above arrangement, the circuit board 1 can be uniformly and efficiently cooled.

FIG. 2 shows a case wherein the used cooling medium is directly discharged. However, as shown in FIG. 3, a heat exchanger 6 connected between the cooling medium supply pipe 4 and the cooling medium recovery pipe 5, may be arranged to circulate the cooling medium.

FIG. 4 is a sectional view showing a detailed example of the circuit board cooling apparatus according to the basic principle of the present invention. This structure has a plurality of circuit boards 1 vertically stacked parallel to each other. In this circuit board arrangement, two nozzles 2 are arranged on both the sides of each circuit board 1 such that the circuit board 1 is sandwiched between the nozzles 2. A cooling medium is supplied from a cooling medium supply pipe 4 on the right side of FIG. 4 to the nozzles 2. The nozzle 2 of this example has a frame 2d with a perforated plate. The cooling medium ejected from the ejection holes 2b of the perforated plate to the circuit boards 1 is recovered by a cooling medium recovery pipe 5 on the left side of FIG. 4.

Figure 5A:
FIGS. 5A to 5D are sectional and plan views showing an example of a perforated plate used in the circuit board cooling apparatus according to the basic principle of the present invention.
Figure 5B:
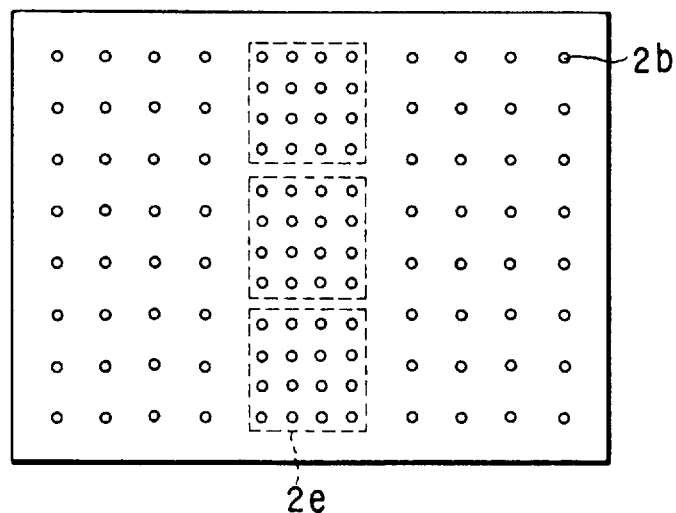

FIGS. 5A and 5B are sectional and plan views showing an example of the perforated plate used in the circuit board cooling apparatus according to the basic principle of the present invention. According to this example, the cooling effect is fortified for parts (e.g., MCMs) which generate a larger amount of heat than that of a general semiconductor element which generates heat. More specifically, at the position of the perforated plate, where the cooling medium is to be ejected to such parts that generate a large amount of heat, the number of ejection holes 2b per unit area is increased as compared to that at other positions. In this example, the cooling effect is enhanced by increasing the number of ejection holes 2b per unit area.

Figure 5C:
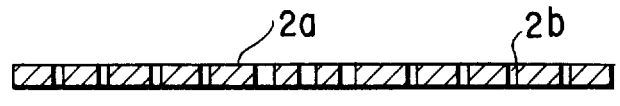
Figure 5D:
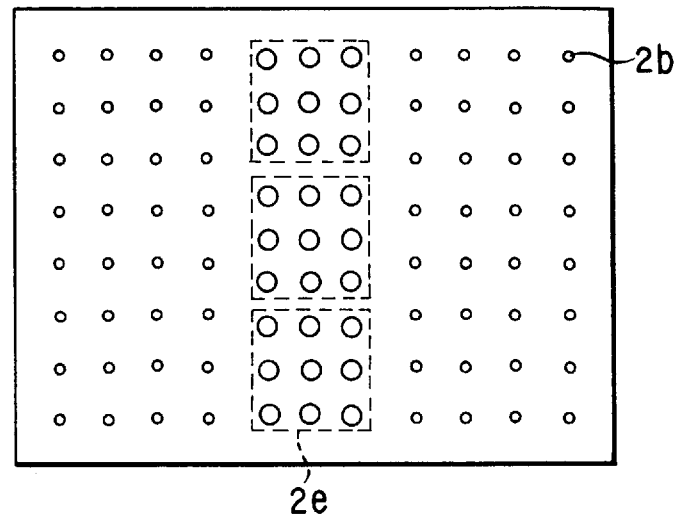

Instead, the cooling effect may be increased by enlarging the opening of the hole 2b per unit area as shown in FIGS. 5C and 5D, for example.

Figure 6:
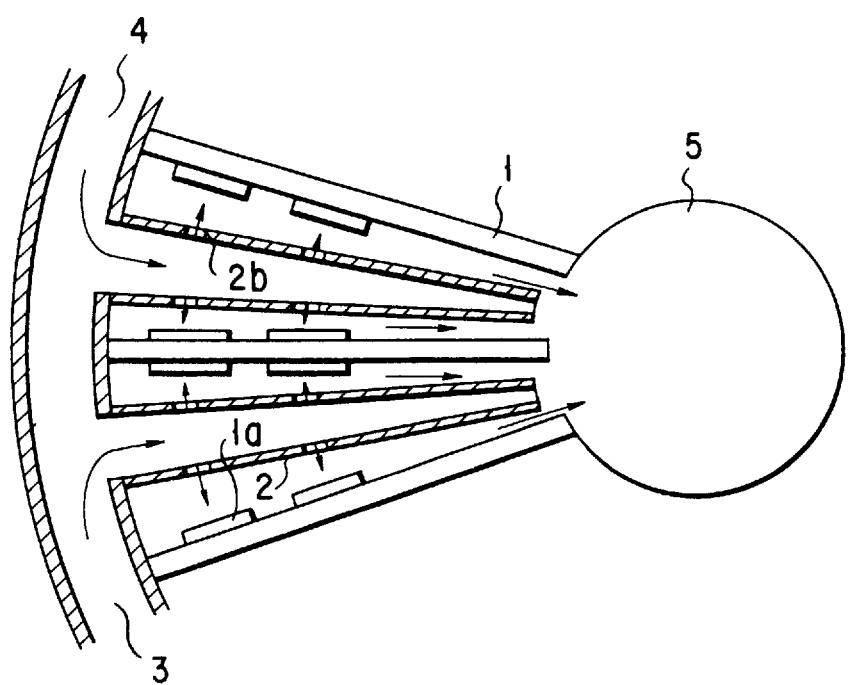
FIG. 6 is a sectional view showing another detailed example of the circuit board cooling apparatus according to the basic principle of the present invention.

FIG. 6 is a sectional view showing another detailed example of the circuit board cooling apparatus according to the basic principle of the present invention. Unlike FIG. 4, this structure has a plurality of circuit boards 1 arranged radially (in a circle). In this circuit board arrangement, nozzles 2 are arranged on both the sides of each circuit board 1 such that the circuit board 1 is sandwiched between the nozzles 2. A cooling medium is supplied from a cooling medium supply pipe 4 on the left side of FIG. 6 to the nozzles 2. The cooling medium ejected from the ejection holes 2b of a perforated plate to the circuit boards 1 is recovered by a cooling medium recovery pipe 5 on the right side of FIG. 6. The circuit board cooling apparatus having this structure is employed in each embodiment to be described later.

In the above circuit board cooling apparatus, the nozzles 2 may be supported by the circuit boards 1 and connected to the cooling medium supply pipe 4 through flexible pipes. In addition, the circuit board cooling apparatus may further comprises a packing having flexibility and arranged between the frame 2d and the perforated plate.

The embodiments of the present invention will be described below with reference to the accompanying drawings.

(First Embodiment)

Figure 7:
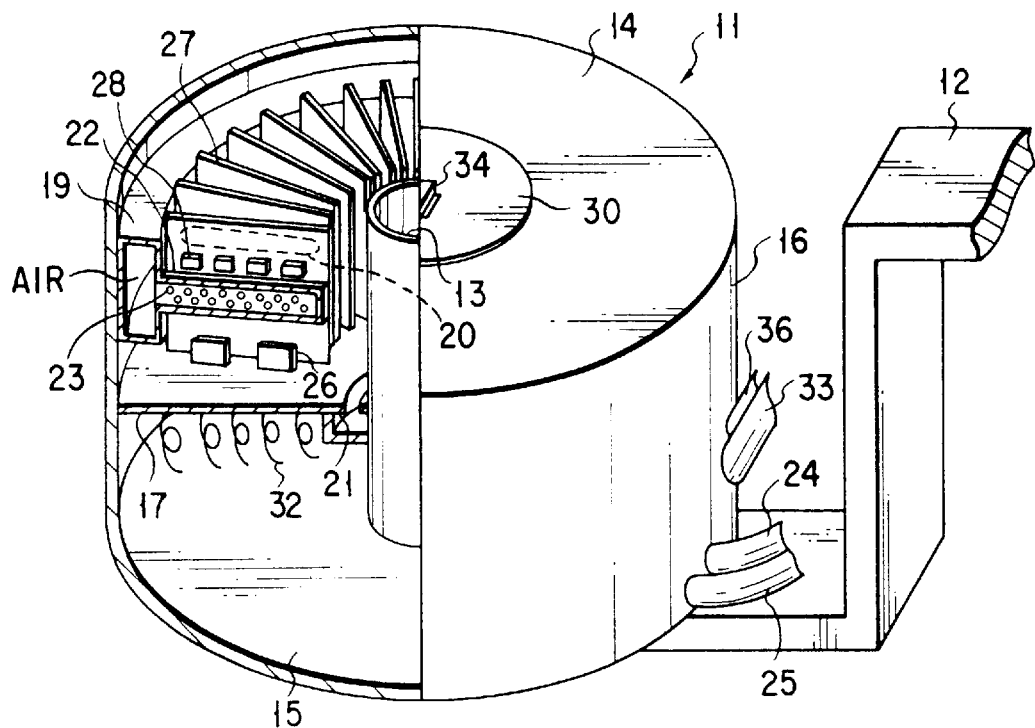
FIG. 7 is a perspective view showing the overall arrangement of a circuit board cooling apparatus according to the first embodiment of the present invention.
Figure 8:
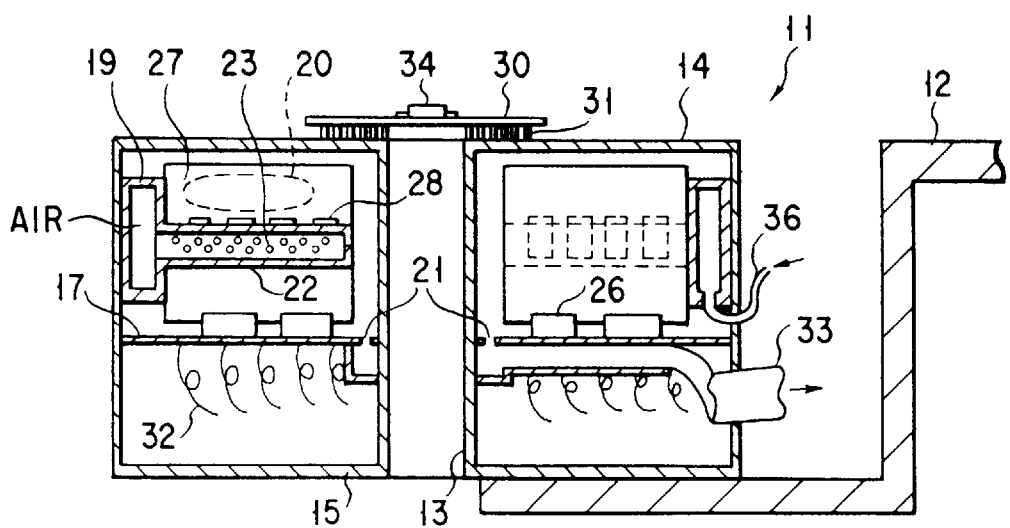
FIG. 8 is a sectional view showing the internal arrangement of the circuit board cooling apparatus shown in FIG. 7.

FIG. 7 is a perspective view showing the overall arrangement of a circuit board cooling apparatus according to the first embodiment of the present invention. FIG. 8 is a sectional view showing the internal arrangement of the circuit board cooling apparatus shown in FIG. 7.

A test head 11 is used to test a wafer or the like on which an IC (Integrated Circuit) is mounted. The test head 11 is rotatably supported by a rest 12. When an arbitrary IC 34 is to be attached, the test head 11 is positioned such that the IC 34 comes to the uppermost portion of the apparatus, as shown in FIG. 7. An IC contact board 30 is attached to be electrically connected to pins 31 projecting from the upper surface of the test head 11 (the top of a case 14).

After the arbitrary IC 34 is attached to the IC socket of the IC contact board 30, the characteristics of the IC 34 are checked using a plurality of ICs 28 mounted on circuit boards 27. The internal structure of the test head 11 will be described below.

The interior of the test head 11 is divided into two chambers, i.e., a circuit board container unit 16 and a wire container unit 15, by a mother board 17. A microscope column 13 through which a microscope (not shown) is set to observe the IC 34 is arranged at the central portion. The circuit boards 27 in the circuit board container unit 16 are arranged perpendicular to the top of the case 14 and radially at predetermined angular intervals around the microscope column 13. The circuit boards 27 are supported on the mother board 17 through a circuit board support unit 26. A plurality of wires 32 from the circuit boards 27 extend into the wire container unit 15 through the mother board 17, and bundles of wires 32 are extracted from the side wall of the test head 11 as cables 24 and 25.

A circuit board cooling system will be described below.

A supply pipe 19 for supplying a cooling medium is arranged in the circuit board container unit 16 at the peripheral portion. Nozzles 22 are connected to the supply pipe 19. The nozzles 22 are arranged not to contact the circuit boards 27 and the ICs 28. On surfaces opposing the circuit boards 27, each nozzle 22 has holes 23 for ejecting the cooling medium. At least one hole 23 is formed in correspondence with one IC 28 on the circuit board 27.

The circuit board 27 also has a parts portion 20 of a resistor, a capacitor, a diode, and the like which generate a small amount of heat. The circuit boards 27 are covered with the case 14. A vent hole 21 is formed on the microscope column 13 side. The vent hole 21 is connected to a discharge pipe 33 to communicate with the outside of the test head 11.

An operation of the first embodiment with the above arrangement will be described. Air (cooling medium) which is temperature-controlled by a temperature controller (not shown) arranged at a filter and a regulator is supplied from the factory or nitrogen atmosphere to the supply pipe 19.

Figure 9:
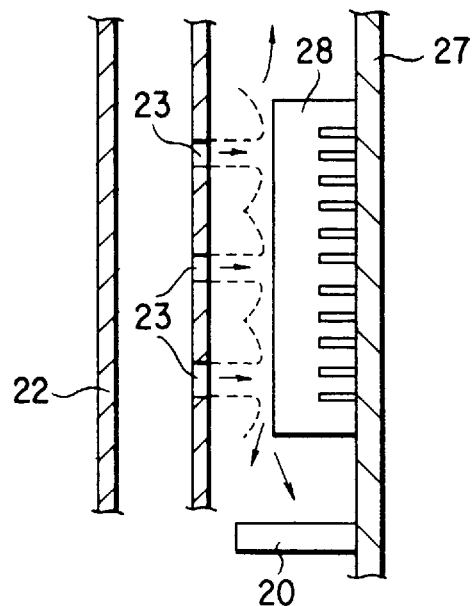
FIG. 9 is an enlarged sectional view showing the structure near a nozzle and a circuit board which are arranged in the circuit board cooling apparatus shown in FIG. 7.

FIG. 9 is an enlarged sectional view showing the structure near the nozzle and the circuit board which are arranged in the circuit board cooling apparatus shown in FIG. 7. As shown in FIG. 9, the air from the supply pipe 19 also flows in the nozzle 22. The air is forcibly ejected from the holes 23 formed on the surface of the nozzle 22 opposing the circuit board to the IC 28 mounted on the circuit board, so that impingement cooling is performed. Arrows in FIG. 9 indicate the flow of air, and broken lines indicate the jet range of the air impinging against the IC 28.

The air impinges on the IC 28 and spreads in every directions on the circuit board 27. The spread air passes by the parts portion 20 which generates a small amount of heat. Since the circuit boards 27 are covered with the case 14, the air passes through the vent hole 21 formed on the microscope column 13 side and the discharge pipe 33 and is discharged from the test head 11. The interior of the test head 11 is pressurized with the factory atmosphere. Therefore, the air ejected from the nozzles 22 exits from the test head 11 by itself without using any auxiliary power from a fan or the like.

The flow of heat will be described below. Heat generated from the ICs 28 mounted on the circuit boards 27 is removed by air blowing from the nozzles 22. The hot air which has received the heat of the ICs 28 spreads in every directions. After removal of the heat of the parts portion 20 which generates a small amount of heat, the air passes through the vent hole 21 and is discharged from the test head 11 together with the heat.

With this structure, air blown from the holes 23 of the nozzles 22 against the ICs 28 is always at a predetermined temperature. Therefore, the temperatures of the ICs 28 mounted on the circuit boards 27 can be uniformed.

When a wafer on which an IC 34 is mounted is to be tested, the test head 11 in the state shown in FIG. 7 is turned over such that the IC 34 faces a measurement table (not shown) on which the wafer is mounted. Thereafter, the pins 31 are electrically connected to the wafer, and test of the IC 34 is started.

Conventionally, heat generated from ICs mounted on circuit boards is removed by a cooling medium, and the temperature of the cooling medium inevitably increases along the direction of the flow of the cooling medium. In the first embodiment, however, the temperature of air blowing from the holes 23 of the nozzles 22 against the ICs 28 is almost constant, so that the circuit boards 27 can be uniformly and efficiently cooled. In addition, various ICs 28 different in size, height, or generation amount of heat can also be uniformly cooled only by changing the diameter of each hole 23 of the nozzles 22 or the pitch between the circuit boards 27 and the nozzles 22. Therefore, variations in performance between ICs caused by temperature differences can be minimized.

When holes 23 having an appropriate size or an appropriate number of holes 23 are formed at necessary positions on the nozzles 22, temperature control of the circuit boards 27 can also be performed.

New air passes by the parts portions 20 generating a small amount of heat when air which has removed the heat of the ICs 28 generating a large amount of heat is discharged from the circuit board container unit 16. Since heat exchange is performed at the parts portions 20, the cooling efficiency is increased by re-cooling.

Unlike the prior art, no extra power such as a fan or pump is needed, so that a compact and inexpensive circuit board cooling apparatus can be constituted.

As described above, even when the height or shape of the ICs 28 changes, heat generated from the ICs 28 can be uniformly removed, so that variations in performance between the ICs 28 caused by temperature differences can be minimized.

Since the cooling operation can be performed at a flow rate lower than that of the prior art, noise and vibration can be reduced. Therefore, the operator feels no discomfort, and adverse effects on the ICs 28 to be tested can also be prevented.

Since the test head 11 has no directly attached fan, the test head 11 can be prevented from becoming bulky, and high integration of the ICs 28 on the circuit boards 27 is not impeded.

With the cover of the case 14, noise of air blowing from the holes 23 of the nozzles 22 can also be reduced.

(Second Embodiment)

The second embodiment will be described below. The same reference numerals as in the first embodiment denote the same constituent elements in the second embodiment, and a detailed description thereof will be omitted.

Figure 10:
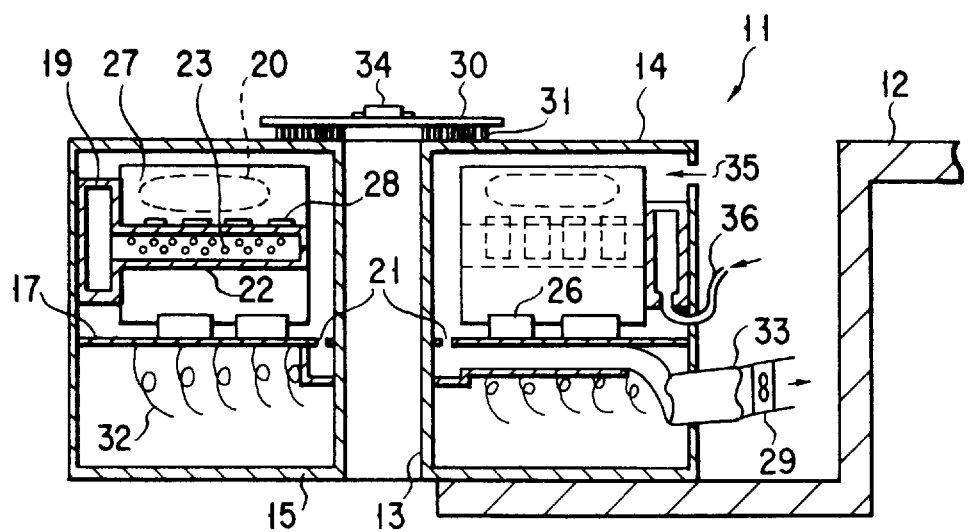
FIG. 10 is a sectional view showing the internal arrangement of a circuit board cooling apparatus according to the second embodiment of the present invention.

FIG. 10 is a sectional view showing the internal arrangement of a circuit board cooling apparatus according to the second embodiment of the present invention.

The second embodiment is characterized in that a fan 29 is arranged in a discharge pipe 33 communicating with a vent hole 21, and a supply port 35 is directly formed in a case 14 covering circuit boards 27.

Air ejected from ejection holes 23 impinges on ICs 28 and spreads in every directions on the circuit boards. The spread air passes by a parts portion 20 that generates a small amount of heat. Since the circuit boards 27 are covered with the case 14, the air passes through the vent hole 21 formed on the microscope column 13 side and the discharge pipe 33 and is discharged from a test head 11. The interior of the test head 11 is pressurized with the factory atmosphere. Therefore, the air blowing from nozzles 22 or air passing through the supply port 35 with a filter passes through the vent hole 21, is guided to the discharge pipe 33 by the fan 29, and exits from the test head 11.

As described above, since the air is drawn from the vent hole 21 by the driving force of the fan 29, air passing through the supply port 35 also passes on the surfaces of the ICs 28 and the parts portions 20 that generate a small amount of heat.

The flow of heat will be described below. Heat generated from the ICs 28 mounted on the circuit boards 27 is removed by air blowing from the nozzles 22. The hot air spreads in every directions. After removal of the heat of the parts portion 20 that generates a small amount of heat, the air passes through the vent hole 21 and is discharged from the test head 11 together with the heat.

With this structure, the following effects can be obtained in addition to the effects obtained in the first embodiment. That is, the air blowing from the holes of nozzles 22 against the ICs 28 can be maintained at a predetermined temperature, so that the temperatures of the ICs 28 mounted on the circuit boards 27 can be uniformed. In addition, the cooling effect can be further increased.

(Third Embodiment)

The third embodiment will be described below. The same reference numerals as in the first embodiment denote the same constituent elements in the third embodiment, and a detailed description thereof will be omitted.

FIG. 11 is a schematic view showing the first arrangement of a cooling pipe and an auxiliary pipe which are used in the circuit board cooling apparatus shown in FIG. 7. FIG. 12 is a schematic view showing the second arrangement of the cooling pipe and the auxiliary pipe which are used in the circuit board cooling apparatus shown in FIG. 7.

The third embodiment is characterized in that an auxiliary pipe is arranged in addition to normal nozzles. A sectional area of the auxiliary pipe 52 is larger than that of the nozzles 22.

A cooling system will be mainly described below.

A supply pipe 19 is arranged on the peripheral side of a circuit board container unit (not shown). Cooling medium which is temperature-controlled by a temperature controller arranged at a filter and a regulator (neither are shown) is supplied from a pump to the supply pipe 19. One end of each nozzle 22 is connected to the supply pipe 19, and the other end of the nozzle 22 is connected to the recovery pipe 51.

FIG. 11 is a schematic view showing an arrangement of a cooling pipe and the auxiliary pipe used in the circuit board cooling apparatus shown in FIG. 7.

As shown in FIG. 11, an auxiliary pipe 52 is arranged at a position furthest from the entrance and exit of the supply pipe 19. The auxiliary pipe 52 is arranged between the circuit boards, like the nozzles 22. The auxiliary pipe 52 is formed to have a sectional area different from that of the nozzle 22, and more specifically, larger than that of the nozzle 22. A cooling plate (not shown) is fixed to the nozzles 22.

In FIG. 11, the supply pipe 19 has one entrance and one exit. However, as shown in FIG. 12, the entrance and exit of the supply pipe 19 may have a forked structure. In this case as well, the auxiliary pipe 52 is arranged at a position furthest from the entrance and exit of the supply pipe 19.

Heat generated from ICs mounted on circuit boards is transferred to the cooling plate (not shown) thermally contacting the ICs. Since the cooling plate is connected to the nozzles 22, the heat is exhausted from the apparatus with the cooling medium flowing through the nozzles 22 by an external heat exchanger (not shown). More specifically, the water flows from the entrance of the supply pipe 19 through the nozzles 22 and the auxiliary pipe 52, and is discharged through the recovery pipe 51.

Since the nozzles 22 are attached to thermally contact the circuit boards through the cooling plate, the cooling capacity for the circuit boards largely depends on the flow rate of the cooling medium. More specifically, as the flow rate of the cooling medium becomes higher, the cooling capability becomes higher. As the flow rate becomes lower, the cooling capability becomes lower. In the prior art, the flow rate in the nozzles changes depending on position. However, when the auxiliary pipe 52 having a sectional area larger than that of the nozzle 22 is arranged, the flow rate of the cooling medium flowing through the nozzles 22 can be made almost constant. Since the flow rates in the nozzles 22 are uniform, all ICs mounted on the circuit boards can be uniformly cooled. Therefore, variations in performance between the ICs caused by temperature differences can be minimized.

As has been described above in detail, according to the present invention, a circuit board cooling apparatus capable of uniformly and efficiently removing heat generated from semiconductor elements and minimizing variations in performance between the semiconductor elements caused by temperature differences is realized.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

For example, the number or positions of nozzles or holes can be arbitrarily determined in accordance with the positions of ICs. Fine temperature control of circuit boards can be performed by changing the diameter or pitch of the holes. The circuit boards can have any arrangement including parallel arrangement and vertical mounting as far as the circuit boards that generate heat oppose the holes of nozzles. The shape or number of nozzles or auxiliary pipes can be freely determined as far as the cooling effect is obtained.

The present invention can be applied not only to circuit boards, as described in the above embodiments, but also to a calculator, an LSI tester, a communication equipment (switching equipment), an industrial control apparatus, a housing of electronic equipment, and the like.

What is claimed is:

1. A circuit board cooling apparatus for cooling a plurality of circuit boards on which semiconductor elements are mounted, comprising:

a plurality of ducts coupled to a common inlet and a common outlet, the plurality of ducts receiving a cooling medium of liquid from the common inlet and discharging the cooling medium through the common outlet, each of said circuit boards being arranged between two adjacent ducts of the plurality of ducts such that the cooling medium received by the plurality of ducts conducts heat away from said plurality of circuit boards, said plurality of ducts including a first duct located furthest from the inlet and the outlet and a second duct located closest to the inlet and the outlet, the first duct having an average cross-sectional area that is larger than the average cross-sectional area of the second duct;

a cooling medium supply pipe that supplies the cooling medium through said inlet; and a cooling medium recovery pipe that recovers the cooling medium through said outlet.

2. An apparatus according to claim 1, wherein the flow rates of the cooling medium through said plurality of ducts are uniform.

3. An apparatus according to claim 1, wherein said cooling medium comprises cooling water.

4. A circuit board cooling apparatus for cooling a plurality of circuit boards on which semiconductor elements are mounted, comprising:

a plurality of ducts, each of said circuit boards being arranged between two adjacent ducts of the plurality of ducts so that a cooling medium of liquid received by said plurality of ducts conducts heat away from said plurality of circuit boards;

a first pipe having an inlet that distributes the cooling medium to said plurality of ducts; and a second pipe having an outlet that receives the cooling medium from said plurality of ducts, wherein said plurality of ducts includes a first duct located furthest from the inlet and the outlet and a second duct located closest to the inlet and the outlet, the first duct having an average cross-sectional area that is larger than the average cross-sectional area of the second duct.

5. An apparatus according to claim 4, further comprising:

a cooling medium supply pipe for supplying the cooling medium through said inlet; and a cooling medium recovery pipe for recovering the cooling medium through said outlet.

6. An apparatus according to claim 5, wherein connecting portions of said cooling medium supply pipe and said first pipe form a forked structure.

7. An apparatus according to claim 6, wherein connecting portions of said cooling medium recovery pipe and said second pipe form a forked structure.

8. An apparatus according to claim 4, wherein the flow rates of the cooling medium through said plurality of ducts are uniform.

9. An apparatus according to claim 4, wherein said cooling medium comprises cooling water.

10. A method of cooling a plurality of circuit boards on which semiconductor elements are mounted, comprising the steps of:

supplying a plurality of ducts having a common inlet and a common outlet with a cooling medium of liquid that is received from the common inlet and discharged through the common outlet;

arranging said plurality of circuit boards such that each circuit board is between two adjacent ducts of the plurality of ducts so that the cooling medium supplied to the ducts conducts heat away from said plurality of circuit boards; and providing a first duct, located furthest from said inlet and said outlet, with a cross-sectional area that is larger than the cross-sectional area of a second duct located closest to said inlet and said outlet.

11. A method according to claim 10, further comprising the step of conveying the cooling medium through said plurality of ducts at a uniform rate.

12. A method according to claim 10, further comprising the step of providing cooling water as the cooling medium.

13. A method of cooling a plurality of circuit boards on which semiconductor elements are mounted, comprising the steps of:

supplying a plurality of ducts with a cooling medium of liquid;

arranging the plurality of circuit boards such that each circuit board is between two adjacent ducts of the plurality of ducts so that the cooling medium supplied to the ducts conducts heat away from said plurality of circuit boards;

distributing the cooling medium to the ducts with a first pipe having an inlet through which the cooling medium is distributed to the ducts;

removing the cooling medium from said plurality of ducts with a second pipe having an outlet through which the cooling medium is received from the ducts; and providing a first duct, located furthest from the inlet and the outlet, with an average cross-sectional area that is larger than the average cross-sectional area of a second duct located closest to the inlet and the outlet.

14. A method according to claim 13, further comprising the step of conveying the cooling medium through said plurality of ducts at a uniform rate.

15. A method according to claim 13, further comprising the step of providing cooling water as the cooling medium.

* * * * *